United States Patent
Berens et al.

(10) Patent No.: US 7,277,508 B2
(45) Date of Patent: Oct. 2, 2007

(54) METHOD OF DECODING A TURBO-CODE ENCODED SIGNAL IN A RECEIVER AND CORRESPONDING RECEIVER

(75) Inventors: Friedbert Berens, Geneva (CH); Ettore Messina, Crozet (FR); Miguel Kirsch, Conches (CH)

(73) Assignee: STMicroelectronics N.V., Amsterdam (NL)

( * ) Notice: Subject to any disclaimer, the term of this patent is extended or adjusted under 35 U.S.C. 154(b) by 745 days.

(21) Appl. No.: 10/693,674

(22) Filed: Oct. 24, 2003

(65) Prior Publication Data

US 2004/0151259 A1   Aug. 5, 2004

(30) Foreign Application Priority Data

Oct. 24, 2002   (EP)   .................................. 02023841

(51) Int. Cl.
 *H03D 1/00* (2006.01)
 *H03M 13/03* (2006.01)
(52) U.S. Cl. ....................................... 375/341; 714/795
(58) Field of Classification Search ................ 375/340, 375/341, 316; 714/794, 795; 707/1, 10
See application file for complete search history.

(56) References Cited

U.S. PATENT DOCUMENTS

| | | | |
|---|---|---|---|
| 7,127,443 B2 * | 10/2006 | Gueguen et al. ................ | 707/1 |
| 2002/0010894 A1 * | 1/2002 | Wolf et al. ................... | 714/793 |
| 2003/0002603 A1 * | 1/2003 | Worm et al. ................. | 375/341 |

FOREIGN PATENT DOCUMENTS

| | | |
|---|---|---|
| EP | 1119110 | 7/2001 |
| EP | 1134902 | 9/2001 |
| EP | 1204212 | 5/2002 |
| WO | WO 01/82486 | 11/2001 |

OTHER PUBLICATIONS

Chuang, Justin C. et al. *Medium Access Control for Advanced Cellular Internet Services*, Personal, Indoor and Mobile Radio Communications, 1997, pp. 673-677, XP010247732.
Chuang, Justin C. et al. *Power Control for Dynamic Packet Assignment in Advanced Cellular Internet Service*, Vehicular Technology Conference, 1998, pp. 1750-1754, XP010288220.
European Search Report dated Mar. 31, 2003 for European Application No. 02023841.

* cited by examiner

*Primary Examiner*—Khai Tran
(74) *Attorney, Agent, or Firm*—Lisa K. Jorgenson; Stephen Bongini; Fleit Kain Gibbons Gutman Bongini & Bianco P.L.

(57) ABSTRACT

A method is provided for decoding a turbo-code encoded signal in a receiver. According to the method, the signal is received from a transmission channel, and the signal is digitally turbo-code decoded. Additionally, a quality information representative of conditions of the channel state estimation is dynamically determined, and the quality information is dynamically compared with a predetermined criteria for defining good or bad estimation conditions. A Maximum-A-Posteriori algorithm in the logarithmic domain is dynamically selected for good estimation conditions, or an approximation of the Maximum-A-Posteriori algorithm in the logarithmic domain is dynamically selected for bad estimation conditions. Also provided is a receiver that implements such a decoding method.

28 Claims, 3 Drawing Sheets

METHOD OF DECODING A TURBO-CODE ENCODED SIGNAL IN A RECEIVER AND CORRESPONDING RECEIVER

CROSS-REFERENCE TO RELATED APPLICATIONS

This application is based upon and claims priority from European Patent Application No. 02023841.6, filed Oct. 24, 2002, the entire disclosure of which is herein incorporated by reference.

BACKGROUND OF THE INVENTION

1. Field of the Invention

The present invention relates to channel decoding techniques, and more specifically to a method of decoding a turbo-code encoded signal in a receiver and a corresponding receiver.

2. Description of Related Art

The present invention is directed in general to the field of wireless communication systems, and more particularly to CDMA systems such as the different CDMA based mobile radio systems like CDMA 2000, WCDMA (Wide Band CDMA) or the IS-95 standard.

In mobile radio systems, channel coding is used to make the data transmission over the mobile radio channel more robust against noise and interference. Standard channel coding schemes used in existing mobile radio systems like GSM are Convolutional Coding, Reed Salomon Coding and other kinds of block codes.

The third generation mobile radio system specifies Convolutional codes as well as Turbo-codes as channel coding techniques [3GPP, Technical Specification Group Radio Access Network, *Multiplexing and channel coding (FDD)*, 3G TS 25.212 version 3.5.0 (2000-12), Release 1999].

In Turbo-code encoders, forward error correction is enabled by introducing parity bits. For Turbo-codes, the original information, denoted as systematic information, is transmitted together with the parity information. The encoder for 3GPP is two recursive systematic convolutional (RSC) encoders with constraint length K=4, which can also be interpreted as 8-state finite state machines. The first RSC encoder works on the block of information in its original sequence, the second one in an interleaved sequence.

On the receiver side, there is a corresponding component decoder for each of them. Each component decoder implements a Maximum-A-Posteriori (MAP) Algorithm, and is usually a Soft-in-Soft-out (SISO) decoder.

Each block is decoded in an iterative manner. The systematic information and the parity information serve as inputs of the first component decoder MAP1. The soft-output of MAP1 reflects its confidence on the received bits of having been sent either as '0' or '1'. These confidences are interleaved in the same manner as in the encoder and passed to the second component decoder MAP2 as a-priori information. The second component decoder uses this information to bias its estimation comprising the interleaved systematic information and the parity information of the second encoder. The soft-outputs are again passed on to MAP1, and so on. The exchange continues until a stop criterion is fulfilled. Stop criteria range from simple cases, such as "fixed number of iterations", over cyclic redundancy check (CRC) to rather complex statistical analysis.

Implementation issues for Turbo-decoder architectures using the MAP algorithm have already been discussed in several papers and are well known [A. Worm, *Implementation Issues of Turbo-Decoders*, PhD thesis, Institute of Microelectronic Systems, Department of Electrical Engineering and Information Technology, University of Kaiserslautern, Forschungsberichte Mikroelektronik, Bd.3, Germany, 2001].

The MAP algorithm is transformed into the logarithmic domain to reduce operator strength [S. S. Pietrobond and A. S. Barbulescu, A Simplification of the Modified Bahl Decoding Algorithm for Systematic Convolutional Codes, *Proc. International Symposium on Information Theory and its Applications*, pages 1073-1077, Sydney, Australia, November 1994] Multiplications become additions, and additions are replaced by a modified comparison. It has a forward recursion, a backward recursion and soft-output calculation.

Two well known MAP algorithms work in the logarithmic domain. The first one is the "LogMAP" algorithm and shows the same performance as the ideal MAP algorithm using exponential functions.

The second one is the "MaxLogMAP" algorithm and is a sub-optimum version of the LogMAP algorithm.

In principle, the performance of a LogMAP based turbo-code decoder is better than the performance of a MaxLogMAP based turbo-code decoder. However, under certain circumstances, the performance of the MaxLogMAP based decoder is much more robust and exceeds the performance of the LogMAP based decoder.

In conventional systems, only one of the above-mentioned decoding algorithms are used, either the LogMAP or the MaxLogMAP algorithm.

SUMMARY OF THE INVENTION

In view of these drawbacks, it is an object of the present invention to overcome the above-mentioned drawbacks and to provide dynamic switching in a turbo-decoder so that the overall turbo-decoder always operates in the best mode (e.g., either LogMAP or MaxLogMAP) depending on the transmission conditions.

One embodiment of the present invention provides a method for decoding a turbo-code encoded signal in a receiver. According to the method, the signal is received from a transmission channel, and the signal is digitally turbo-code decoded. Additionally, a quality information representative of conditions of the channel state estimation is dynamically determined, and the quality information is dynamically compared with a predetermined criteria for defining good or bad estimation conditions. A Maximum-A-Posteriori algorithm in the logarithmic domain is dynamically selected for good estimation conditions, or an approximation of the Maximum-A-Posteriori algorithm in the logarithmic domain is dynamically selected for bad estimation conditions.

Another embodiment of the present invention provides a receiver that includes reception means for receiving a turbo-code encoded signal from a transmission channel, and digital processing means coupled to the reception means. The digital processing means includes demodulation means and turbo-code decoding means. The turbo-code decoding means is controllably configurable, in response to a control signal, between a first configuration that implements a Maximum-A-Posteriori algorithm in the logarithmic domain and a second configuration that implements an approximation of the Maximum-A-Posteriori algorithm in the logarithmic domain. The digital processing means further includes auxiliary processing means for determining a quality information representative of conditions of the channel state estimation, and control means. The control means compares the quality information with a predetermined criteria and delivers the control signal with a first value corresponding to good estimation conditions or with a second value corresponding to bad estimation conditions.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
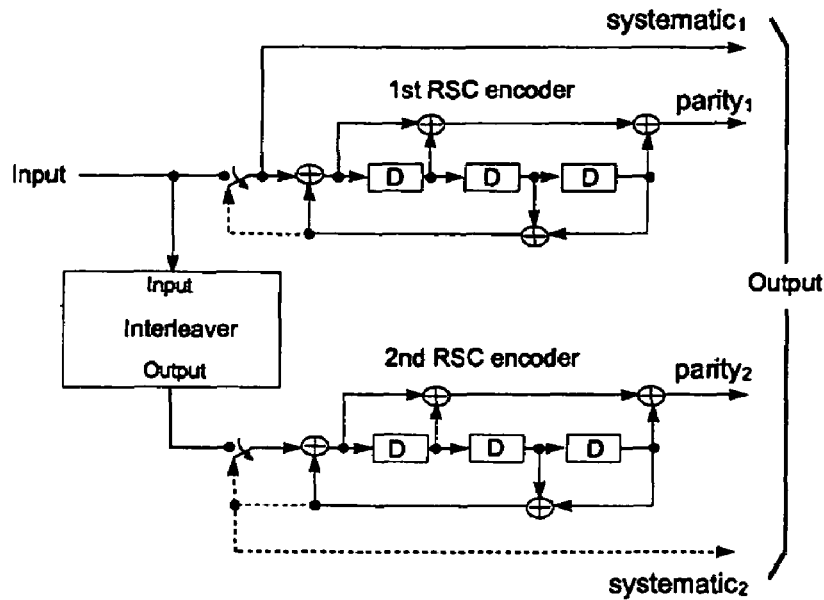
FIG. 1 shows a UMTS Turbo-code encoder.

Preferred embodiments of the present invention will be described in detail hereinbelow with reference to the attached drawings.

Preferred embodiments of the present invention provide methods of decoding a turbo-code encoded signal in a receiver and corresponding receivers. One preferred embodiment provides a method in which an incident turbo-code encoded signal is received from a transmission channel and digitally turbo-code decoded. There is dynamically determined a quality information representative of the conditions of the channel state estimation, and the quality information is dynamically compared with a predetermined criteria for defining a binary result corresponding to good or bad estimation conditions. The turbo-code decoding step includes dynamically selecting a Maximum-A-Posteriori algorithm in the logarithmic domain (e.g., the LogMAP algorithm) in the presence of good conditions, or an approximation of the Maximum-A-Posteriori algorithm in the logarithmic domain (e.g., the MaxLogMAP algorithm) in the presence of bad conditions.

Preferably, the conditions of the channel state estimation are predicted by knowing the quality of the Signal to Interference Ratio (SIR) estimation.

More precisely, according to an embodiment of the present invention, the determination step comprises determining an error information representing an error of the SIR estimation, the error information being the quality information. Additionally, the predetermined criteria comprises at least one predetermined threshold.

In one embodiment, the error information is the absolute value of the error of the SIR estimation, and the LogMAP algorithm is selected if the absolute value of the error is smaller than the threshold, whereas the MaxLogMAP algorithm is selected if the absolute value of the error is greater than or equal to the threshold.

Preferably, the threshold is chosen so that it is smaller than or equal to about 0.5 dB, and more preferably it is equal to about 0.2 dB.

One possibility for calculating the absolute value of the error of the SIR estimation is calculating the variance of the SIR estimation.

However, the inventors have observed that it can be much simpler to predict the conditions of the channel state estimation by knowing the speed of the receiver (when the receiver is mobile) or the speed of a mobile terminal cooperating with the receiver (when the receiver is a base station, for example).

According to an embodiment of the present invention in which the receiver is mobile, for example a cellular mobile phone, and belongs to a wireless communication system, the determination step comprises a mobile receiver speed estimation, the speed being the error information.

According to another embodiment of the present invention in which the receiver is a base station cooperating with a mobile terminal, for example a cellular mobile phone, the determination step comprises a mobile terminal speed estimation, the speed being the error information.

When the speed is considered as an error information, the predetermined criteria can comprise also the delay profile of the transmission channel. More precisely, the delay profile can be used for determining thresholds used to select either the LogMAP algorithm or the MaxLogMAP algorithm.

Another preferred embodiment of the present invention provides a receiver that includes reception means for receiving an incident turbo-code encoded signal from a transmission channel, and digital processing means connected to the reception means and including demodulation means and turbo-code decoding means. The turbo-code decoding means is controllably configurable, in response to a binary control signal, between a first configuration implementing a Maximum-A-Posteriori algorithm in the logarithmic domain (e.g., LogMAP algorithm), and a second configuration implementing an approximation of the Maximum-A-Posteriori algorithm in the logarithmic domain (e.g., MaxLogMAP) algorithm. The digital processing means further includes auxiliary processing means for dynamically determining a quality information representative of the conditions of the channel state estimation, and control means for dynamically comparing the quality information with a predetermined criteria and delivering the binary control signal having a first value corresponding to good estimation conditions and a second value corresponding to bad estimation conditions. The turbo-code decoding means is dynamically switched in the first configuration when the binary control signal has the first value, and in the second configuration when the binary control signal has the second value.

According to an embodiment of the present invention, the auxiliary processing means includes means for determining an error information representing an error of the Signal to Interference Ratio estimation, the error information being the quality information, and the predetermined criteria comprises at least one predetermined threshold.

According to one embodiment of the present invention, the error information is the absolute value of the error of the SIR estimation and the control signal has the first value if the absolute value of the error is smaller than the threshold, and the second value if the absolute value of the error is greater than or equal to the threshold.

In one embodiment in which the receiver is mobile and belongs to a wireless communication system, the auxiliary processing means includes speed estimation means for determining the speed of the mobile receiver, the speed being the error information.

In another embodiment in which the receiver belongs to a wireless communication system and cooperates with a mobile terminal, the auxiliary processing means includes speed estimation means for determining the speed of the mobile terminal, the speed being the error information.

Exemplary embodiments of the present invention will now be described in detail with reference to FIGS. 1-5. Before explaining the dynamic switching of the decoding algorithm according to a preferred embodiment of the present invention, some well known general features of the two algorithms being used will be explained for ease of understanding.

1. Encoding 1.1. General Considerations and Convolutional Encoding

Convolutional encoding is performed by calculating the modulo-2 sum of the input values of the current and/or selected previous time steps. Implementation therefore is straightforward and mainly uses a shift register and a couple of exclusive-OR gates. Through the way those are switched, different kinds of convolutional codes can be realized, such as the following.

Systematic Codes: One of the output streams is equal to the input stream, the systematic information.

Non-Systematic Codes (NSC): Each output is a parity information. Parity information is produced by taking the modulo-2 sum of shift register entries stating the history of the encoding process.

Recursive Codes: A special parity signal is produced and fed back in conjunction with the systematic input.

Non-Recursive Codes: No such feedback loop exists.

An instance of a convolutional encoder is defined by a combination of these properties, the memory depth (constraint length) and the logical functions used to produce the parity information. These properties are described through generator polynomials.

1.2. Code-Trellis

A code trellis is the unrolled state chart of a finite-state machine. The number of states the encoder can be in (N) is a function of the constraint length K.

$$N=2K-1$$

Depending on the nature of the code (RSC, NSC, and so on) only certain transitions are possible. A trellis is used to depict those transitions.

1.3. Trellis-Termination

For the considered codes the initial state of the trellis is always known to be the all-zero state. Without taking any precautions, the encoder ends in an arbitrary state, leaving no hint of where to start the backward recursion. This can be counteracted by driving the encoder into a defined final state. Reaching the final state (e.g., the all-zero state) can be achieved by appending a sequence which steers the encoder towards the final state as fast as possible. This sequence is also dependent on the state the encoder is in after the last information bit has been coded. The length of this sequence is equal to K−1; the transmitted bits are called tailbits.

1.4. Interleaving

Trellis based decoding is very vulnerable to burst errors. If a sequence of transmitted bits is corrupted, the decoding becomes inaccurate. Therefore, a scheme to break up the neighborhood-relations is applied: the interleaving.

The key idea behind interleaving is to transmit the bits in a different order than they are produced or consumed. For instance, while bit 4 is encoded consecutively with its neighbors 3 and 5, it might be next to 312 and 1021 during transmission. A burst error in the channel effects bits 312, 4, and 1021. On the receiver side, these errors are spread again through the deinterleaver, which restores the initial order. Thus, the decoding is less affected.

1.5. Turbo-Encoding

A Turbo-code encoder is two constituent convolutional encoders and an interleaver. The convolutional codes are fixed to be the RSC codes of rate ½ and generator polynomials (13,15/(octal notation) introduced before.

The systematic information of the second encoder is not transmitted because it can be reconstructed (by deinterleaving) from the systematic output of the first encoder. By this a rate of R=⅓ is achieved. FIG. 1 shows the detailed UMTS Turbo-code encoder. The trellis termination leads each encoder into its final state separately. This dissolves the dependency between the systematic information of the first and second encoder for the tailbits, because these lead each encoder independent from the other by activating the respective switch (see FIG. 1). Hence the last six bits per encoder (systematic and parity for each) have to be transmitted separately. This results in a total overhead of 12 bits per block.

2. Decoding

Decoding convolutional codes is keeping track of the transitions that took place in the encoder. From those the input symbols which have been sent are deducted. Due to the degradations caused by the channel, only estimates of the systematic and parity bits are available, which will both be called channel values here. There are two different kinds of outputs.

Hard values: They merely indicate if a symbol is supposed to be "1" or "0".

Soft values: These also deliver a measure for the reliability of the decision (the hard decision is extend by the probability that the decision is correct).

For Turbo decoding, only soft-in values are relevant. Based on the channel values, probabilities can be computed that certain combinations of systematic and parity bit occurred. From this and considering the encoder history, the probability that the encoder was in a given state at a given time-step can be computed.

Two approaches exist to deal with those state-probabilities. The maximum likelihood based Viterbi algorithm uses them to search the most likely code-word. For this it traverses the trellis from the all-zero state to the end state and looks for the most likely sequence. The states chosen for the survivor path indicate the most likely sequence of symbols that has been sent. Hence a Viterbi Decoder is a sequence estimator.

The maximum-a-posteriori (MAP) algorithm on the other side estimates the probability that the encoder was in the given state and that the current state leads to the final state given the remainder of the channel values. This can be efficiently computed by a forward and backward recursion over the trellis. Afterwards, for each bit the probabilities for those states associated with a systematic "0" are added and compared to those associated with a "1". The symbol with the higher probability is assumed to be the sent one. As this works on bit rather than on sequence level, it is called symbol estimation.

Turbo decoding demands for soft-output of the convolutional decoders as well. Suitable algorithms are the MAP algorithm and the SOVA (Soft Output Viterbi Algorithm).

The SOVA is usually implemented as a two-step algorithm, with a Viterbi algorithm part and a part responsible for calculating the soft-outputs. The state metric unit of the part realizing the Viterbi can be implemented based on a traceback or a register-exchange structure. The soft-output calculation part is mainly a competing path computation unit. Except for low throughputs, this unit is implemented as a register-exchange architecture. A major drawback of register exchange units is that they do not lend themselves well to hardware folding. It is therefore difficult (if not impossible) to obtain efficient SOVA architectures for a wide range of throughput requirements. Furthermore, the communication performance of the SOVA with optimal soft update can only be as good as the sub-optimum MaxLogMAP algorithm. For an efficient implementation the MAP algorithm is implemented.

2.1. Turbo Decoding

Decoding Turbo-codes by searching the most likely codeword is far too complex. Therefore iterative decoding is advised. The two convolutional codes are decoded separately. While doing this, each decoder incorporates information that has been gathered by the other. This "gathering of information" is the exchange of soft-output values, where the bit-estimates of one unit are transformed into a priori information for the next. The decoders hence have to be soft-input soft-output (SISO) units.

The confidence in the bit estimation is represented as a Log-Likelihood-Ratio (LLR).

$$\Lambda(d_k) = \ln \frac{P(d_k = 1)}{P(d_k = 0)} \quad (2.1)$$

The sign shows whether this bit is supposed to be one or zero, whereas the confidence in the decision is represented by the magnitude.

In order to extract the information that has been gathered during the last decoding stage, the systematic and a priori information that lead to this estimate have to be subtracted. This yields the following.

$$L^1(d_k)=\Lambda^1(d_k)-y_k^s-L_{deint}^2(d_k) \quad (2.2)$$

$$L^2(d_k)=\Lambda^2(d_k)-y_{kint}^s-L_{int}^1(d_k) \quad (2.3)$$

This is called the extrinsic information.

The confidence of one decoder in a bit to have a certain value biases the initial guess of the other.

Figure 2:
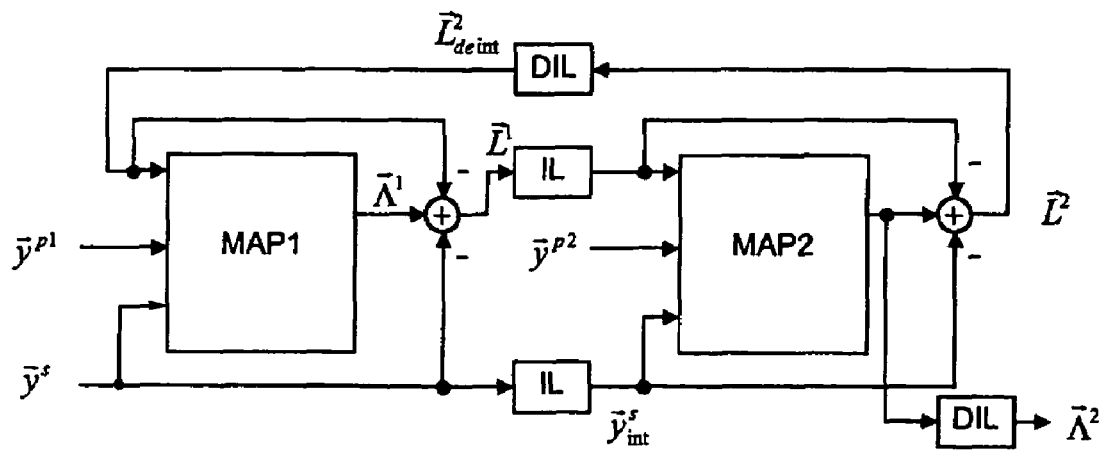
FIG. 2 shows a generic Turbo decoder.

FIG. 2 shows such a Turbo-code decoder having two MAP decoders, an interleaver and a deinterleaver. Feeding the input of one decoder as a priori information input to the next enables the improvement over the decoding iterations. It also gives Turbo-codes their name, as it resembles the "feedback-of-exhaust" used in turbo combustion engines. Inputs to the decoder are the received channel values (systematic, parity1 and parity2); during the very first MAP1 operation, the a priori information is set to zero.

2.2. The Maximum-A-Posteriori (MAP) Algorithm

The name "Maximum-A-Posteriori" stems from the fact that the estimation of the bits is based on the whole receiver sequence. It is done after all the information is in.

Equation 2.4 shows the output of such a MAP decoder.

Bahl et al. described an efficient algorithm for the MAP decoder, which is based on recursions operating on the trellis in forward and backward recursion [L. Bahl, J. Cocke, F. Jelinek, and J. Raviv, Optimal Decoding of Linear Codes for Minimizing Symbol Error Rate, *IEEE Transaction on Information Theory*, IT-20:284-287, March 1974]. That algorithm is commonly referred to as MAP or BCJR algorithm:

Let $R_k=(y_k^s, y_k^{p1}, L_k^2)$ denote the input of the MAP, with $\vec{R}=(R_1, \ldots, R_k, \ldots R_N)$, where N is the length of the block, then the BCJR-algorithm computes the a-posteriori probabilities (APP)

$$\Lambda(d_k) = \ln \frac{\Pr\{d_k = 1 \mid \vec{R}\}}{\Pr\{d_k = 0 \mid \vec{R}\}} \quad (2.4)$$

for each data symbol $d_k$ after reception of the symbol sequence $\vec{R}$.

It is computed using two probabilities: one, that the encoder has reached state $S_k^m$, with $m \in \{1 \ldots 2^M\}$ after k received symbols:

$$\alpha_k(m)=Pr\{(S_k^m|R_0 \ldots R_{k-1}\} \quad (2.5)$$

and another, that the remainder of the input sequence will lead the encoder to the final state given the state $S_{k+1}^{m'}$ at time k+1:

$$\beta_{k+1}(m')=Pr\{(R_k \ldots R_N|S_{k+1}^{m'}\} \quad (2.6)$$

For this, the probability of a transition from state $S_k^m$ to $S_{k+1}^{m'}$ has to be known. It is dependent on the code structure, the channel model, the extrinsic information of previous decoding steps and the received symbols $R_k$:

$$\gamma(S_k^m, S_{k+1}^{m'})=Pr\{(S_k^m, S_{k+1}^{m'}|R_k\} \quad (2.7)$$

Using $\gamma, \alpha$ and $\beta$ can be computed recursively by:

$$\alpha_k(m') = \sum_m \alpha_{k-1}(m) \cdot \gamma(S_{k-1}^m, S_k^{m'}) \quad (2.8)$$

$$\beta_k(m) = \sum_{m'} \beta_{k+1}(m') \cdot \gamma(S_{k-1}^m, S_k^{m'}) \quad (2.9)$$

A known start and final state are necessary for the BCJR algorithm to perform optimally. If the trellis is not terminated, all states have to be assumed to have equal probability for k=N.

The a-posteriori probability itself can be expressed as $$\Lambda(d_k) = \ln \frac{\sum_m \sum_{m'} \gamma(S_{k-1}^m, S_k^{m'}, d_k = 1) \cdot \alpha_{k-1}(m) \cdot \beta_k(m')}{\sum_m \sum_{m'} \gamma(S_{k-1}^m, S_k^{m'}, d_k = 0) \cdot \alpha_{k-1}(m) \cdot \beta_k(m')} \quad (2.10)$$

The large number of multiplications involved in the computation of the APP makes it less attractive for implementation. Therefore the MAP algorithm has to be transformed to the logarithmic domain, where it becomes the LogMAP algorithm, which increases numerical stability and eases implementation, while not degrading the error correction performance.

2.3. The MAP Algorithm in the Logarithm Domain: LogMAP

The transformation of multiplications into additions is the motivation for defining the MAP algorithm in the Log-Domain. A problem is posed by the additions. Using the Jacobian logarithm, the additions are substituted by a new operator:

$$ln(e^{\delta 1}+e^{\delta 2})=\max \quad *(\delta 1,\delta 2)=\max \quad (\delta 1,\delta 2)+ln(1+e^{-|\delta 1-\delta 2|})$$

Similar the negative logarithm can be taken, this leads to $$\min{}^*(\delta 1, \delta 2) = \min(\delta 1, \delta 2) - \ln(1 + e^{-|\delta 1 - \delta 2|}).$$

For more than two operands, the max* is applied recursively. Since the operator is associative, a tree-like evaluation can be employed, which is advantageous for hardware implementation. The sub-optimal MaxLogMAP algorithm is obtained by using the approximation $$\max{}^*(\delta 1, \delta 2) \approx \max(\delta 1, \delta 2).$$

Using the max* operation, the recursions become:

$$\ln(\alpha_k(m')) = \max_m{}^*(\ln(\alpha_{k-1}(m)) + \ln(\gamma(S_{k-1}^m, S_k^{m'}))), \quad (2.11)$$

$$\ln(\beta_k(m)) = \max_{m'}{}^*(\ln(\beta_{k+1}(m')) + \ln(\gamma(S_k^m, S_{k+1}^{m'}))) \quad (2.12)$$

Let $\ln(\alpha_k(m'))$ from now on be denoted as $\overline{\alpha}_k(m')$ (accordingly for $\beta$ and $\gamma$), then the recursions take the form:

$$\overline{\alpha}_k(m') = \max_m{}^*(\overline{\alpha}_{k-1}(m) + \overline{\gamma}(S_{k-1}^m, S_k^{m'})), \quad (2.13)$$

$$\overline{\beta}_k(m) = \max_{m'}{}^*(\overline{\beta}_{k+1}(m') + \overline{\gamma}(S_k^m, S_{k+1}^{m'})). \quad (2.14)$$

Similar we get:

$$\Lambda(d_k) = \max_{m,m'}{}^*(\overline{\gamma}(S_{k-1}^m, S_k^{m'}, d_k=1) + \overline{\alpha}_{k-1}(m) + \overline{\beta}_k(m')) - \max_{m,m'}{}^*(\overline{\gamma}(S_{k-1}^m, S_k^{m'}, d_k=0) + \overline{\alpha}_{k-1}(m) + \overline{\beta}_k(m')) \quad (2.15)$$

Computation $\overline{\gamma}$ of includes the estimation of channel values and the a priori information. Whereas the conventional method is quite complicated, an optimized branch metric calculation is used. Prior to transmission, every bit is subject to a transformation. Let $x_k \in \{0,1\}$ denote the (coded) bit, then the transmitted value is $$y_k = -2 \cdot x_k + 1, \text{ hence } y_k \in \{-1, 1\}.$$

Thus the actual mapping is '1'→'−1' and '0'→'1'.

There are only four different values per k in total the $\overline{\gamma}$ can take, one for every assumption ($x_k^s \in \{-1,1\}, x_k^p \in \{-1,1\}$). The code-structure alone determines which of them is assigned to which transition. After skipping constant factors and making additional algebraic transformations we get:

$$\overline{\gamma}(x_k^s = +1, x_k^p = +1) = 0$$

$$\overline{\gamma}(x_k^s = +1, x_k^p = -1) = \frac{4E_s y_k^p}{N_0} \quad (2.16)$$

$$\overline{\gamma}(x_k^s = -1, x_k^p = +1) = \frac{4E_s y_k^p}{N_0} + L(d_k)$$

$$\overline{\gamma}(x_k^s = -1, x_k^p = -1) = \frac{4E_s y_k^p}{N_0} + \frac{4E_s y_k^p}{N_0} + L(d_k)$$

This simplifies the implementation significantly, as only two terms have to be computed from the channel and a priori data. One term can be dropped completely and the last one be computed from the first two. The scaling factor $$\frac{4E_s}{N_0}$$

is multiplied externally by usage of a working point.

3. Dynamic Switching of the Decoding Algorithm

Figure 3:
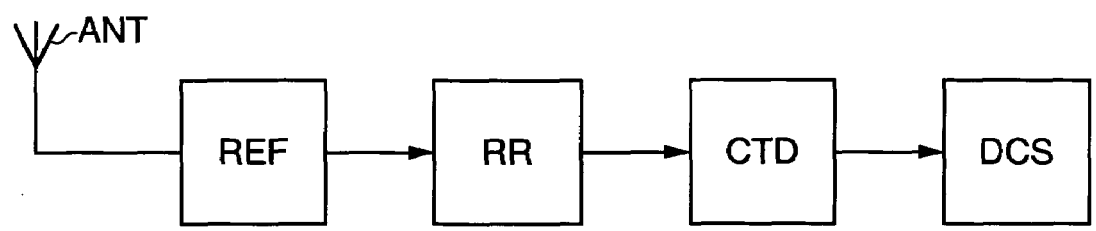
FIG. 3 shows a receiving chain of a mobile phone according to a preferred embodiment of the present invention.

FIGS. 3 illustrates a channel decoding stage according to a preferred embodiment of the present invention. In this exemplary embodiment, the channel decoder is illustratively incorporated into the reception chain of a cellular mobile phone TP.

As shown, the encoded signal is received by the antenna ANT and processed by the radio frequency stage REF of the receiver. At the output of the REF stage, the signal is converted into the digital domain by an A/D converter. The digital base band signal is then processed by a "rake" demodulator RR, which is generally used in the case of a CDMA system.

Then, the channel decoding stage includes a channel decoder CTD according to an embodiment of the present invention. The processing chain also includes a source decoding bloc DCS, which performs the source decoding treatments.

Figure 4:
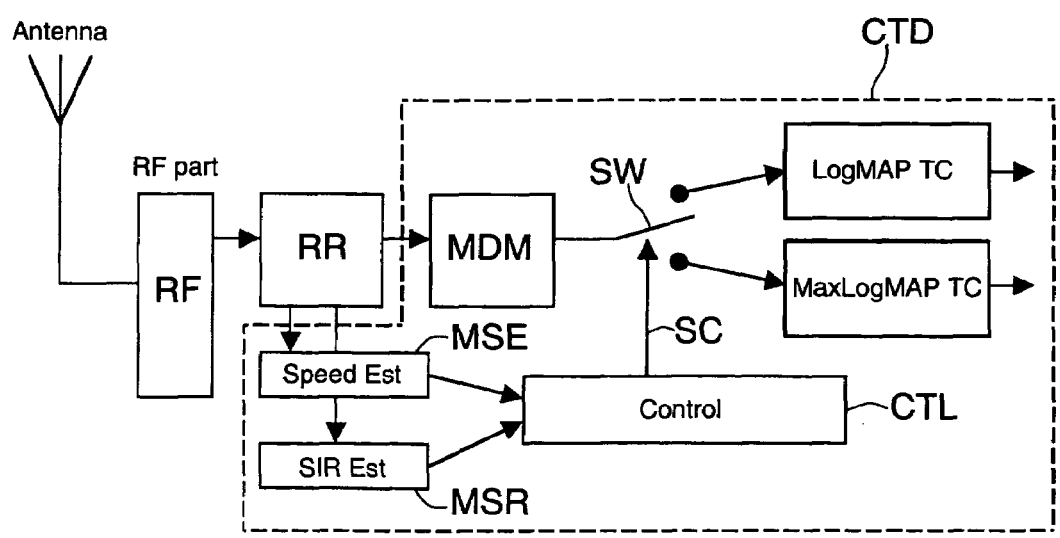
FIG. 4 illustrates in more detail the internal architecture of a channel decoder according to one embodiment of the present invention.

FIG. 4 shows in more detail the channel decoder CTD in accordance with one embodiment of the present invention. The channel decoder CTD comprises conventional preprocessing means MDM (Multiplexer, Interleaver, and Deinterleaver unit) followed by a turbo-code decoder which can controllably implement either a LogMAP algorithm or a MaxLogMAP algorithm, depending on the value of a control signal SC.

In this exemplary embodiment, the control signal SC controls a switch SW which activates or deactivates a ROM memory which contains a logarithmic table. More precisely, if a MaxLogMAP algorithm is used, the ROM memory is activated, whereas it is not activated if only a LogMAP algorithm is used. Thus, the implementation overhead for implementing a turbo-code decoder based on a LogMAP algorithm compared to a MaxLogMAP algorithm is small. The other overhead in silicon is below 2%.

In principle, the performance of the LogMAP based TC decoder is better than the MaxLogMAP based decoder. Since the LogMAP decoder needs a very good channel state estimation in order to scale the input symbols, this is only valid if this estimation is possible and available. Under bad estimation conditions, the MaxLogMAP based decoder behaves much more robustly and exceeds the performance of the LogMAP based decoder. The present invention proposes switching between the two decoder architectures based on the conditions of the channel state estimation.

One way for determining the channel state estimation conditions is to determine the quality of the Signal to Interference Ratio (SIR). More precisely, an error information representing an error of the SIR estimation is determined and is considered as being a quality information.

Then, in general, if the error information is lower than a predetermined threshold, the channel state estimation conditions are considered as being good and the LogMap algorithm is selected. On the contrary, the MaxLogMAP algorithm is selected.

Preferably, this selection is made dynamically. In other words, the channel state conditions are dynamically estimated during the reception of the encoded signal and can be changed during this reception. Consequently, the selection between the two possible algorithms can be changed during the reception, depending for example on the environment of the mobile phone.

According to one embodiment of the present invention, the error information representing an error of the SIR estimation can be the absolute value of the error of the SIR estimation. For example, this absolute value can be determined by calculating the variance of the SIR estimation.

Thus, the channel decoder CTD can comprise means MSR for estimating the SIR. Such means is conventional and well known. For example, reference can be made to the paper of the TSG-RAN Working Group 1 meeting #4 (Shin-Yokohama, Japan, Apr. 18-20, 1999) entitled "Proposal for downlink interference measurement method".

After having estimated the SIR, the control means CTL, which can be easily implemented through software, calculates the variance of this SIR estimation and compares this variance to a predetermined threshold, which in general is preferably smaller than or equal to about 0.5 dB. More preferably, such threshold may be equal to about 0.2 dB.

However, the inventors have observed that the quality of the SIR estimation, and thus the quality of the channel state estimation, can also be predicted by knowing the speed of the mobile phone. And, generally, it is easier to estimate the speed of the mobile phone than to calculate the variance of the SIR.

Any conventional method for estimating the speed of a mobile phone can be used. For example, the speed of a mobile terminal can be estimated using the normalized autocovariance function of the power of the received signal. Another known method, disclosed in EP 1 014 107, uses an autocorrelation of the filtered power of the received signal. Reference can also be made to EP 1 026 518.

Figure 5:
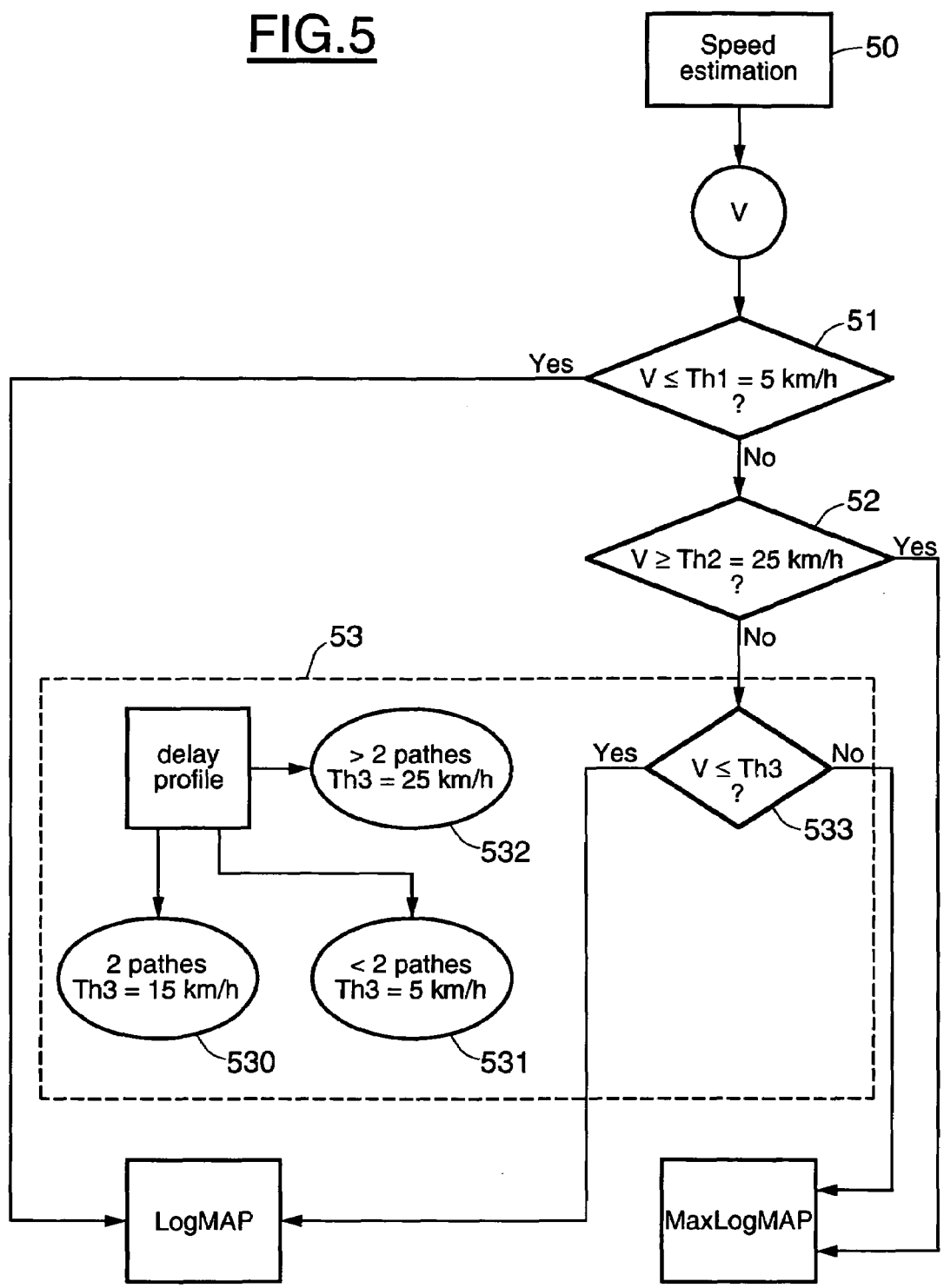
FIG. 5 illustrates a process according to one embodiment of the present invention for selecting between LogMAP and MaxLogMAP algorithms depending on the speed of a mobile phone.

An example of selection between a LogMAP algorithm and a MaxLogMAP algorithm based on a speed estimation is illustrated on FIG. 5.

In this exemplary embodiment, after the speed estimation means MSE has estimated the speed (step 50), the speed V is compared with a first threshold Th1, for example equal to 5 km/h (step 51).

If the speed V is lower than the threshold Th1 (e.g., corresponding to a pedestrian mobile), then the channel state estimation conditions are considered to be good and LogMAP algorithm is selected.

If the speed V is greater than a second threshold Th2, for example equal to 25 km/h (step 52), then the speed is considered to be too high for having good estimation conditions. Thus, the MaxLogMAP algorithm is selected.

If the speed V is between the two thresholds Th1 and Th2, then the delay profile of the transmission channel is considered (step 53).

The delay profile gives the number of paths of the multipath transmission channel, as well as the strength of the fingers of the rake receiver.

A variable threshold Th3 is then determined.

More precisely, if there are only two paths, the threshold Th3 is equal to a first value (15 km/h for example). If there are less than two paths, the threshold Th3 is equal to a second value (5 km/h for example). If there are more than two paths, the threshold Th3 is equal to a third value (25 km/h for example) (steps 530, 531 and 532).

Then, the speed V is compared with the threshold Th3 (step 533).

If the speed V is lower than Th3, the LogMap algorithm is selected, whereas the MaxLogMAP algorithm is selected in the contrary case.

By using a speed estimation algorithm, a dynamic switching of the decoding algorithm can be implemented. Thus, the overall turbo-decoder TC always works in the best performing mode (either LogMAP or MaxLogMAP) depending on the transmission conditions.

The present invention can be implemented in hardware, software, or a combination of hardware and software. Any processor, controller, or other apparatus adapted for carrying out the functionality described herein is suitable. A typical combination of hardware and software could include a general purpose microprocessor (or controller) with a computer program that, when loaded and executed, carries out the functionality described herein.

The present invention can also be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after either or both of the following a) conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of decoding a turbo-code encoded signal in a receiver, said method comprising the steps of:
   receiving the signal from a transmission channel;
   digitally turbo-code decoding the signal;
   dynamically determining a quality information representative of conditions of a channel state estimation; and
   dynamically comparing the quality information with a predetermined criteria for defining good or bad estimation conditions,
   wherein the step of digitally turbo-code decoding includes dynamically selecting a Maximum-A-Posteriori algorithm in the logarithmic domain for good estimation conditions, or an approximation of the Maximum-A-Posteriori algorithm in the logarithmic domain for bad estimation conditions.

2. The method according to claim 1,
   wherein the determining step includes determining an error information representing an error of the Signal to Interference Ratio (SIR) estimation, the error information being the quality information, and
   the predetermined criteria includes at least one predetermined threshold.

3. The method according to claim 2, wherein the error information is an absolute value of the error of the SIR estimation,
the Maximum-A-Posteriori algorithm in the logarithmic domain is the LogMAP algorithm and the approximation of the Maximum-A-Posteriori algorithm in the logarithmic domain is the MaxLogMAP algorithm, and
the LogMAP algorithm is selected if the absolute value of the error is smaller than the threshold and the MaxLogMAP algorithm is selected if the absolute value of the error is greater than or equal to the threshold.

4. The method according to claim 3, wherein the threshold is smaller than or equal to about 0.5 dB.

5. The method according to claim 3, wherein the threshold is equal to about 0.2 dB.

6. The method according to claim 2, wherein the receiver is mobile and the determining step includes estimating a mobile receiver speed, the speed being the error information.

7. The method according to claim 6, wherein the receiver is a cellular mobile phone.

8. The method according to claim 6, wherein the predetermined criteria comprises a delay profile of the transmission channel.

9. The method according to claim 6,
wherein the Maximum-A-Posteriori algorithm in the logarithmic domain is the LogMAP algorithm and the approximation of the Maximum-A-Posteriori algorithm in the logarithmic domain is the MaxLogMAP algorithm,
the predetermined criteria comprises a first predetermined threshold, a second predetermined threshold, which is greater than the first threshold, and a third threshold that depends on a delay profile of the transmission channel,
if the estimated speed is lower than the first threshold, the LogMAP algorithm is selected,
if the estimated speed is greater than the second threshold, the MaxLogMAP algorithm is selected, and
if the estimated speed is between the first and second thresholds, the estimated speed is compared with the third threshold, and if the estimated speed is lower than the third threshold the LogMAP algorithm is selected, whereas if the estimated speed is greater than the third threshold the MaxLogMAP algorithm is selected.

10. The method according to claim 2, wherein the receiver cooperates with a mobile terminal and the determining step includes estimating a mobile terminal speed, the speed being the error information.

11. The method according to claim 10, wherein the receiver is a base station.

12. The method according to claim 10, wherein the predetermined criteria comprises a delay profile of the transmission channel.

13. The method according to claim 1, wherein the Maximum-A-Posteriori algorithm in the logarithmic domain is the LogMAP algorithm and the approximation of the Maximum-A-Posteriori algorithm in the logarithmic domain is the MaxLogMAP algorithm.

14. A receiver comprising:
reception means for receiving a turbo-code encoded signal from a transmission channel;
digital processing means coupled to the reception means, the digital processing means including demodulation means and turbo-code decoding means,
wherein the turbo-code decoding means is controllably configurable, in response to a control signal, between a first configuration that implements a Maximum-A-Posteriori algorithm in the logarithmic domain and a second configuration that implements an approximation of the Maximum-A-Posteriori algorithm in the logarithmic domain, and
the digital processing means further includes:
auxiliary processing means for determining a quality information representative of conditions of a channel state estimation; and
control means for comparing the quality information with a predetermined criteria and delivering the control signal with a first value corresponding to good estimation conditions or with a second value corresponding to bad estimation conditions, the turbo-code decoding means being configured in the first configuration when the control signal has the first value, and in the second configuration when the control signal has the second value.

15. The receiver according to claim 14,
wherein the auxiliary processing means includes means for determining an error information representing an error of the Signal to Interference Ratio (SIR) estimation, the error information being the quality information, and
the predetermined criteria includes at least one predetermined threshold.

16. The receiver according to claim 15,
wherein the error information is the absolute value of the error of the SIR estimation, and
the control signal has the first value if the absolute value of the error is smaller than the threshold, and the second value if the absolute value of the error is greater than or equal to the threshold.

17. The receiver according to claim 16, wherein the threshold is smaller than or equal to about 0.5 dB.

18. The receiver according to claim 16, wherein the threshold is equal to about 0.2 dB.

19. The receiver according to claim 15,
wherein the receiver is mobile, and
the auxiliary processing means includes speed estimation means for determining the speed of the mobile receiver, the speed being the error information.

20. The receiver according to claim 19, wherein the receiver is a cellular mobile phone.

21. The receiver according to claim 19, wherein the predetermined criteria comprises a delay profile of the transmission channel.

22. The receiver according to claim 19,
wherein the predetermined criteria comprises a first predetermined threshold, a second predetermined threshold, which is greater than the first threshold, and a third threshold that depends on a delay profile of the transmission channel,
if the estimated speed is lower than the first threshold, the control signal has the first value,
if the estimated speed is greater than the second threshold, the control signal has the second value, and
if the estimated speed is between the first and second thresholds, the estimated speed is compared with the third threshold, and if the estimated speed is lower than the third threshold the control signal has the first value, whereas if the estimated speed is greater than the third threshold the control signal has the second value.

23. The receiver according to claim 15,
wherein the receiver cooperates with a mobile terminal, and
the auxiliary processing means includes speed estimation means for determining the speed of the mobile terminal, the speed being the error information.

24. The receiver according to claim 23, wherein the receiver is a base station.

25. The receiver according to claim 14, wherein the Maximum-A-Posteriori algorithm in the logarithmic domain is the LogMAP algorithm and the approximation of the Maximum-A-Posteriori algorithm in the logarithmic domain is the MaxLogMAP algorithm.

26. A machine-readable medium encoded with a program for decoding a turbo-code encoded signal in a receiver, said program containing instructions for performing the steps of:
   receiving the signal from a transmission channel;
   digitally turbo-code decoding the signal;
   dynamically determining a quality information representative of conditions of a channel state estimation; and
   dynamically comparing the quality information with a predetermined criteria for defining good or bad estimation conditions,
   wherein the step of digitally turbo-code decoding includes dynamically selecting a Maximum-A-Posteriori algorithm in the logarithmic domain for good estimation conditions, or an approximation of the Maximum-A-Posteriori algorithm in the logarithmic domain for bad estimation conditions.

27. The machine-readable medium according to claim 26, wherein the determining step includes determining an error information representing an error of the Signal to Interference Ratio (SIR) estimation, the error information being the quality information, and
   the predetermined criteria includes at least one predetermined threshold.

28. The machine-readable medium according to claim 26, wherein the Maximum-A-Posteriori algorithm in the logarithmic domain is the LogMAP algorithm and the approximation of the Maximum-A-Posteriori algorithm in the logarithmic domain is the MaxLogMAP algorithm.

* * * * *